United States Patent [19]

Johnson et al.

[11] Patent Number: 4,634,971
[45] Date of Patent: Jan. 6, 1987

[54] PORTABLE HAND-HELD VOLTAGE SENSOR WITH MANUALLY ADJUSTABLE REFERENCE VOLTAGE FOR COMPARISON WITH SENSED VOLTAGE

[75] Inventors: Robert C. Johnson, Dearborn; David L. Perry, Canton; Bernd E. Peitsch, Sterling Heights, all of Mich.

[73] Assignee: Ford Motor Company, Dearborn, Mich.

[21] Appl. No.: 429,415

[22] Filed: Sep. 30, 1982

[51] Int. Cl.$^4$ .................... G01R 19/165; G01R 15/08
[52] U.S. Cl. ................................. 324/133; 324/72.5; 324/115; 324/149; 340/661
[58] Field of Search ................ 324/72.5, 158 P, 149, 324/115, 133–135, 122, 96, 433; 340/660–663, 511, 501, 505; 307/360, 354; 361/90

[56] References Cited

U.S. PATENT DOCUMENTS

| | | | |
|---|---|---|---|
| 988,192 | 3/1911 | Hetherington . | |
| 2,916,699 | 12/1959 | Eisenberg et al. | 324/72.5 |
| 2,941,149 | 6/1960 | Rhodes | 324/110 |
| 2,972,705 | 2/1961 | Howells | 315/135 |
| 3,021,514 | 2/1962 | Regis et al. | 324/133 X |
| 3,072,895 | 1/1963 | Kaufman | 324/133 X |
| 3,157,870 | 11/1964 | Marino et al. | 340/249 |
| 3,343,085 | 9/1967 | Ovshinsky | 324/110 |
| 3,525,939 | 8/1970 | Cartmell | 324/133 |
| 3,534,353 | 10/1970 | Calkin et al. | 340/664 |
| 3,600,610 | 8/1971 | Kelsch | 307/293 |
| 3,641,546 | 2/1972 | Blackburn | 340/661 |
| 3,694,749 | 9/1972 | Woroble | 324/122 X |
| 3,742,351 | 6/1973 | Palmer et al. | 324/72.5 |
| 3,813,665 | 5/1974 | Parfomak et al. | 307/360 X |
| 3,838,339 | 9/1974 | Brandt | 324/133 |
| 3,987,392 | 10/1976 | Kugelmann et al. | 307/360 X |
| 4,011,507 | 3/1977 | Rossell | 324/133 X |
| 4,016,492 | 4/1977 | Miller, Jr. et al. | 324/128 |
| 4,020,414 | 4/1977 | Paredes | 324/133 X |
| 4,109,234 | 8/1978 | Davis | 340/661 X |
| 4,119,797 | 10/1978 | Wollert | 307/360 X |
| 4,157,509 | 6/1979 | Zielinski | 307/360 X |
| 4,160,176 | 7/1979 | Takahashi | 307/362 |
| 4,186,342 | 1/1980 | Kyle | 455/218 |
| 4,217,506 | 8/1980 | Sawyer, Jr. et al. | 307/360 |
| 4,320,285 | 3/1982 | Koether | 324/243 X |
| 4,342,965 | 8/1982 | Baldwin | 307/360 X |
| 4,398,188 | 8/1983 | Feigal et al. | 340/661 X |

FOREIGN PATENT DOCUMENTS

| | | | |
|---|---|---|---|
| 0116277 | 9/1979 | Japan | 361/90 |
| 1104653 | 2/1968 | United Kingdom . | |
| 1150420 | 4/1969 | United Kingdom . | |
| 1233454 | 5/1971 | United Kingdom . | |
| 1305411 | 1/1973 | United Kingdom . | |
| 1427694 | 3/1976 | United Kingdom . | |
| 1447291 | 8/1976 | United Kingdom . | |
| 1480023 | 7/1977 | United Kingdom . | |
| 1569264 | 6/1980 | United Kingdom | 324/133 |
| 1593955 | 7/1981 | United Kingdom . | |
| 1604603 | 12/1981 | United Kingdom . | |

OTHER PUBLICATIONS

Pons, "Comprobador de la Tension en/as Pilas (A Battery Voltage Tester)" Revista Española De Electronics, Dec. 1979, pp. 50–51.

Maddox, "Logic Probe", WE Technical Digest, No. 40, Oct. 1975, pp. 13–15.

Seeger, "Circuit to Simplify Threshold Adjustments", IBM/TDB, vol. 20, No. 2, Jul. 1977, p. 695.

Butler, "Low-Priced Logic Probe Indicates Levels with Tones", Electronics, vol. 48, No. 18, Sep. 4, 1975, p. 118.

"UAA 180 LED Voltmeter", Elektor, vol. 4, No. 1, Jan. 1978, pp. 1/20–1/23.

Carter et al., "Voltage Source Direction Detector with Digital Output", IBM/TDB, vol. 18, No. 7, Dec. 1975, pp. 2116–2117.

Hastings, "Passive Logic Probe", Radio and Electronics Constructor, vol. 33, No. 10, Jun. 1980, pp. 601–603.

*Primary Examiner*—Reinhard J. Eisenzopf
*Assistant Examiner*—Warren S. Edmonds
*Attorney, Agent, or Firm*—Paul K. Godwin, Jr.; Clifford L. Sadler

[57] ABSTRACT

A hand held voltage sensor in which a low impedance test lamp mode or a high impedance voltage test mode is selectable via a thumb accessed slide switch. In the high impedance mode, three light emitting elements provide indication of the value of voltage potential between a probe conductor and an associated ground conductor being above, below or pulsing above an adjustable threshold level.

6 Claims, 8 Drawing Figures

4,634,971

PORTABLE HAND-HELD VOLTAGE SENSOR WITH MANUALLY ADJUSTABLE REFERENCE VOLTAGE FOR COMPARISON WITH SENSED VOLTAGE

BACKGROUND OF THE INVENTION

1. Field of the Invention

The present invention is directed to the field of electrical test equipment and more specifically to the area of voltage measurement devices.

2. Description of the Prior Art

Various instruments have been developed to measure DC voltage levels. Instruments, such as voltmeters, oscilloscopes, test lights and logic probe indicators, are frequently used in automotive applications to troubleshoot for various electrical faults. On the whole, such instruments are adequate and useful but each are dedicated to a particular type of measurement. In addition, such separate instruments are generally inconvenient to use on vehicles since they offer a number of ranges and scales to select from; and require the operator to shift attention from the probe location to the instrument to set up and read the instrument.

SUMMARY OF THE INVENTION

The present invention is intended to provide a unique voltage sensor device in which a voltage probe electrode, a mode switch and voltage indicators are located in a hand-held housing so as to be simultaneously useable and observable.

The device is selectable operable in one of two separate modes. The device provides a low impedance test light between a test probe conductor and a ground connection conductor in a first mode and provides a high impedance (non-loading) sensor that compares the voltage difference between the test probe conductor and the ground connection conductor against an adjustable internal voltage level value, with responsive indications, in a second mode.

In the second mode, the mode switch provides for internal electrical connections to supply internal power to various amplifier and comparator circuits, and to activate indicators when appropriately gated.

In the second mode, the present invention is usable to measure and store the measurement of a DC voltage, to detect or measure and store the measurement of the peak voltage of a dynamic signal, to indicate relative duty cycle or changes in duty cycle of a dynamic signal, to detect and indicate the occurrences of positive voltage transitions (pulses) above a predetermined level and to detect the occurrence of open circuits. Multiple detections and measurements are achieved due to a unique circuit which activates appropriate LED indicators designating that the sensed voltage is above, below or at a level which is adjustable via a graduated thumbwheel on the side of the housing. Therefore, by monitoring the indicators, one can adjust the thumbwheel to the sensed voltage level, even if the graduation scale is not visible during adjustment. On the other hand, the thumbwheel can be preset to a particular voltage level and the indicators will provide information as to whether the sensed voltage level is above, below or periodically pulsing above the preset level.

DETAILED DESCRIPTION OF THE PREFERRED EMBODIMENT

Figure 1:
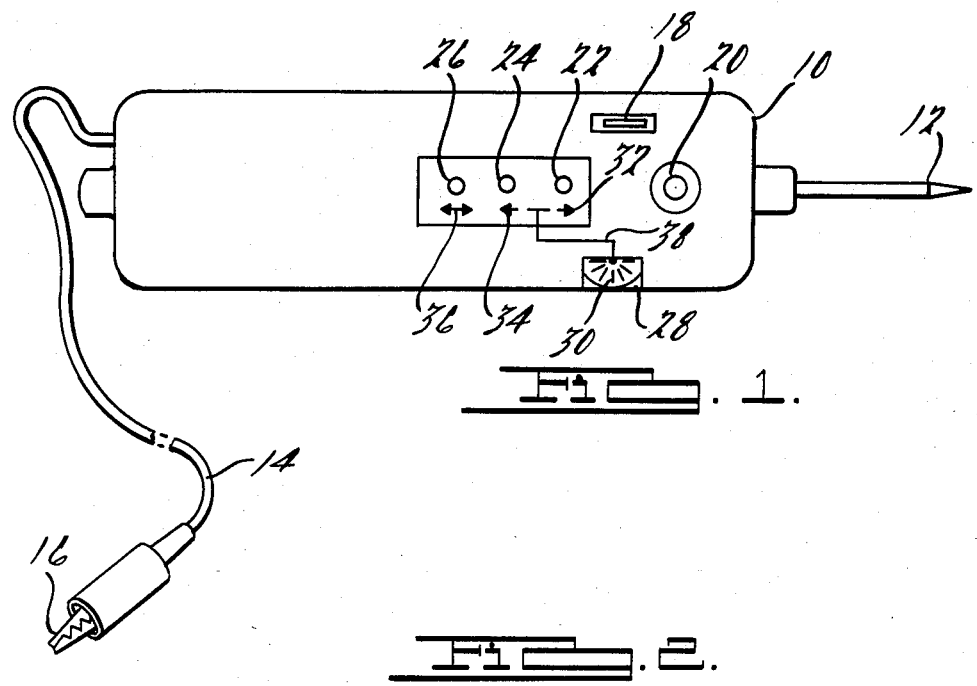
FIG. 1 is a plan view of the housing which embodies the present invention.

The present invention is designed for hand-held use and is embodied in an elongated insulating housing 10, shown in FIG. 1, of appropriate size for such use. An electrically conducting test probe 12 extends from one end of the insulating housing 10. A flexible electrical conductor 14 containing an end clip 16 extends from the opposite end of the housing 10 and is usually connected to a ground potential. A three-position switch 18 is used to switch the mode of operation between OFF, a low impedance TEST LAMP mode and a high impedance VOLTAGE PROBE mode. A test lamp 20 is located on the upper surface of the housing 10 adjacent the switch 18. Light emitting diodes (LEDs) 22, 24 and 26 are also located to be visible on the top surface of the housing 10 and are respectively labeled to indicate that the potential difference between the voltage signal being sensed at the test probe 12 and the reference clip 16 is "ABOVE", "BELOW" or that a "PULSE" has occurred above a preset reference voltage. The preset reference voltage is adjusted via a thumbwheel 28 that is graduated with markings 30 over a range of voltages. Indicia in the form of an arrow 32 adjacent LED 22 indicates that when LED 22 is lit, the voltage difference between the probe 12 and the clip 16 is ABOVE the voltage indicated on the indicia point of the scale 30. Similarly, indicia arrow 34 adjacent the LED 24 indicates that when the LED 24 is lit, the voltage difference between the test probe 12 and the clip 16 is BELOW the indicia setting of the scale 30. The double ended indicia arrow 36 adjacent the LED 26 indicates that whenever the LED 26 is lit, the voltage potential between the probe 24 and the clip 16 PULSE(d) above the preset voltage value indicated on scale 30.

As can be seen from FIG. 1, the layout of the controls and indicators, as well as the electrical probe 12, are such that the entire unit can be utilized with single hand operation without the operator's attention being diverted away from the probe connection.

Figure 2:
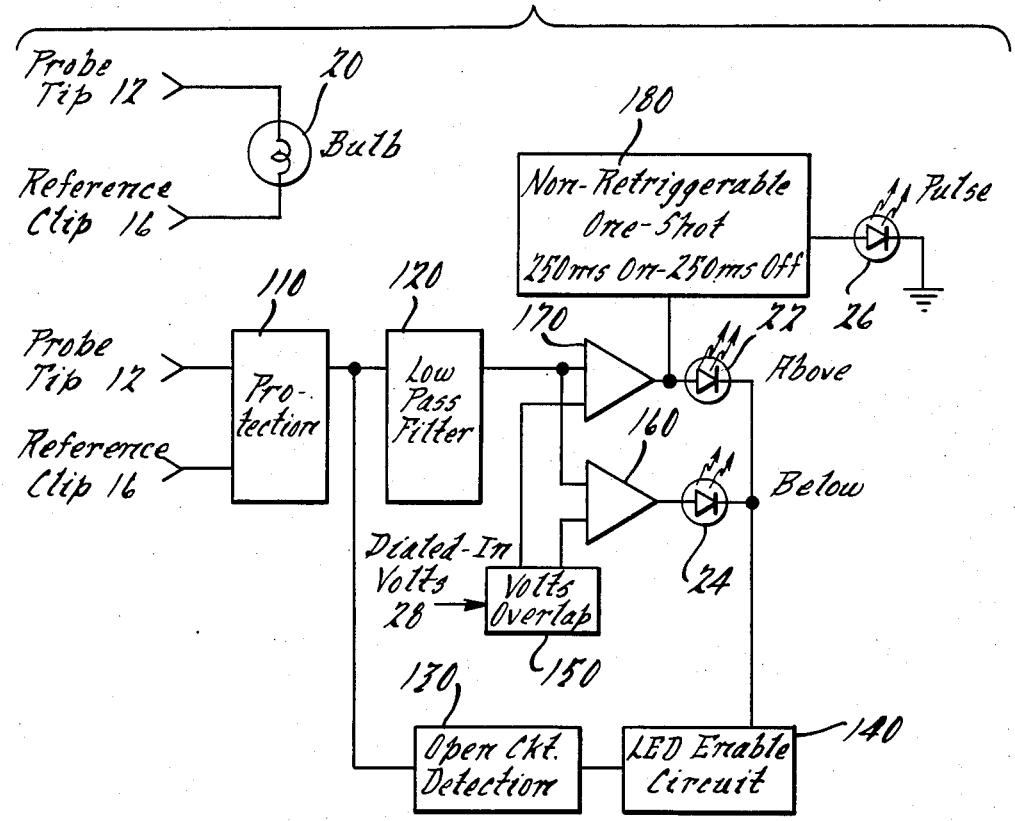
FIG. 2 is a functional block diagram of the present invention.

A block diagram illustrating the major circuit components of the present invention is shown in FIG. 2.

In a first mode of operation, the test lamp 20 is connected directly between the test probe 12 and the reference clip 16. In automotive applications where the system to be checked is in the 10-15 volt operating range, the lamp 20 will be a 12-volt type automotive bulb that glows at various intensities according to the voltage applied between the test probe 12 and the clip 16.

In the second mode of operation, the test probe 12 and the reference clip 16 are connected to a protection circuit 110 which provides for shunting of high voltages that may inadvertently be applied between the probe tip 12 and the reference clip 16, without damaging the device. Input voltage potentials passing through the protection network 110 are applied to a low pass filter 120 and an open circuit detection circuit 130. The low pass filter 120 provides attenuation and filtering of high frequency noise that may be present on the input signal. The sensed voltage is input to an "ABOVE" comparator 170 and a "BELOW" comparator 160. The volts overlapping circuit 150 provides separated reference voltages to the comparators 170 and 160 based upon the value of voltage dialed in from the thumbwheel 28. The output of the comparator 170 controls the activation of the ABOVE LED 22 provided it is enabled by the LED enable circuit 140. Similarly, the comparator 160 controls the activation of BELOW LED 24 which is also enabled by the LED enable circuit 140. The LED enable circuit 140 is normally gated in its enabled condition by open circuit detection circuit 130. However, if the voltage level input from the probe 12 to the open circuit detection circuit 130 is below ground level, with respect to the voltage level present at reference clip 16, the open circuit detection circuit 130 disables the LED enable circuit 140 so that neither of the LEDs 22 and 24 will be energized.

A non-triggerable one-shot multivibrator 180 is connected to receive the output of comparator 170 and control the energization of PULSE LED 26 whenever the output of comparator 170 goes from a low level to a high level. Such an event indicates a positive pulse voltage is sensed at the probe tip 12. The non-retriggerable one-shot multivibrator 180 provides for a 250 millisecond "ON" pulse and a 250 millisecond "OFF" pulse, so that even a very narrow voltage pulse sensed at the probe tip 12 will be visible via the indicator 36.

Figure 3:
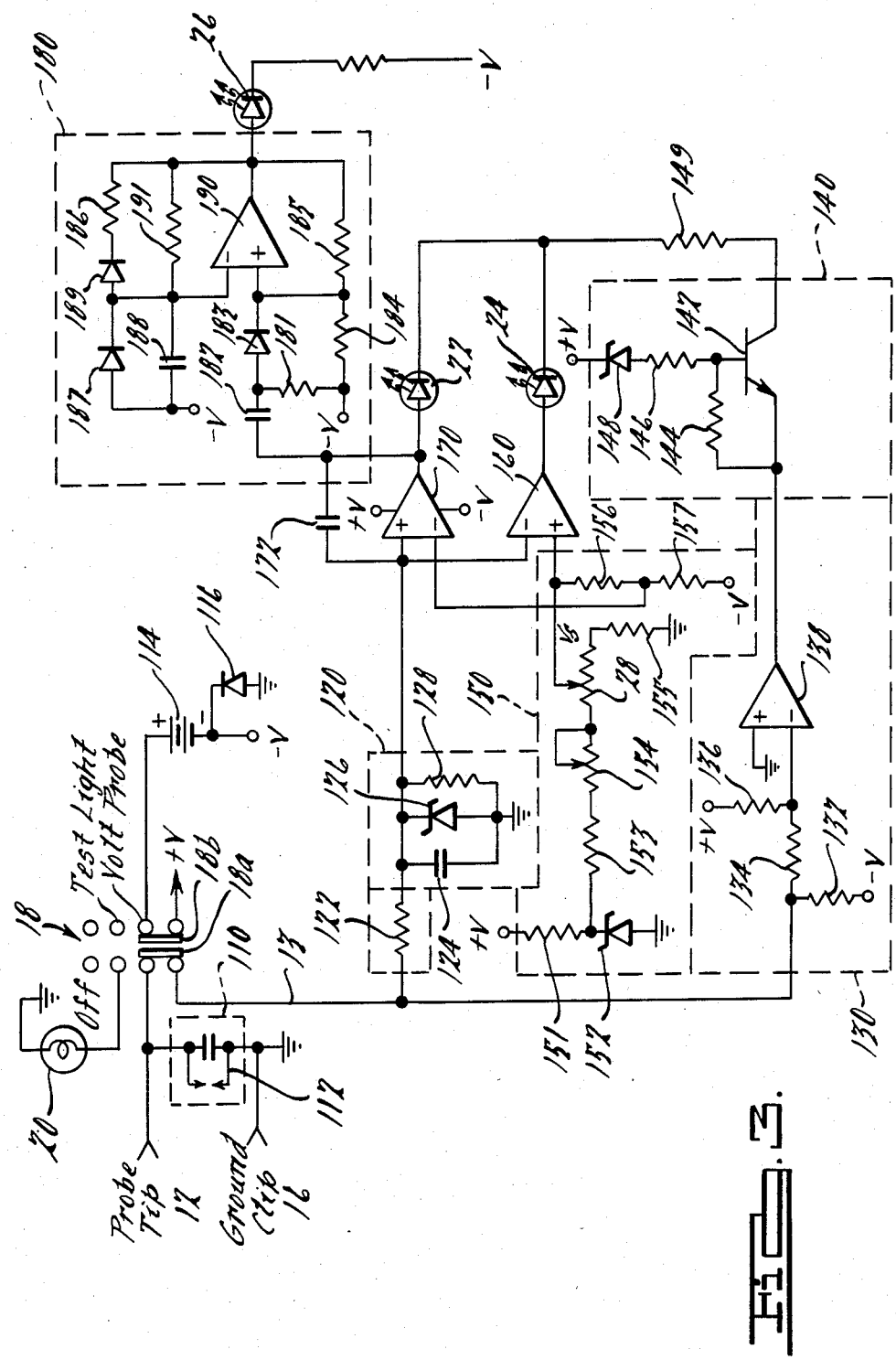
FIG. 3 is a circuit schematic of the present invention.

A more detailed schematic of the present invention is shown in FIG. 3. The switch 18 is a three position type having a pair of slider contacts 18a and 18b, shown in the second mode position, whereby the probe tip 12 is connected to sensed signal line 13. In that second mode position, a battery 114 has its positive terminal electrically connected through slider contact 18b to supply +V operating voltage to the circuits. The protection circuit 110 includes a gapped capacitor 112 which breaks down to a low impedance state when a voltage potential, which exceeds 1-2 kv, is applied thereacross. The group clip 16 is connected through wire 14 to the other side of the protection capacitor 112 and to the ground conductor of the circuit. The sensed voltage on line 13 is dropped across an attenuation resistor 122 of the low pass filter network 120. Capacitor 124 and resistor 128 form the low pass filter by providing a high frequency shunt to ground. Zener diode 126 provides additional protection to the comparators 160 and 170 by providing a shunt whenever the attenuated voltage across resistor 122 exceeds its breakdown voltage properties. The voltage signal dropped across resistor 122 is connected to a non-inverting input terminal of comparator 170 and to an inverted input terminal of comparator 160.

The reference voltages applied to the other input terminals of the comparators 170 and 160 are derived from the volts overlap circuit 150. Zener diode 152 establishes an internal reference voltage since it is connected in series with resistor 151 between the +V potential and ground. The reference voltage is precisely calibrated across a voltage divider network connected between the cathode of Zener diode 152 and ground. The reference voltage divider comprises the resistor 153, a calibration potentiometer 154, the voltage adjusting potentiometer 28 and resistor 155 connected in series. The voltage potential at the wiper of potentiometer 28 establishes the comparison voltage for the BELOW comparator 160 within a predetermined range of values. Calibration potentiometer 154 is internal to the housing and is used for calibrating the probe input voltage to the voltage graduations on the thumbwheel 28. Therefore, if the probe tip voltage at the inverting input terminal of comparator 160 is less than the reference voltage present at the non-inverting terminal of the comparator 160, then the output of comparator 160 will drive the BELOW LED indicator 24.

A divider network portion, comprising resistors 156 and 157, is connected between the wiper of potentiometer 28 and the negative battery potential −V to establish an overlap voltage: a voltage potential at the junction of resistors 156 and 157 that is offset by a predetermined amount so as to be slightly less than the BELOW comparator reference voltage present at the non-inverting terminal of comparator 160. The voltage present at the junction of resistors 156 and 157 is the ABOVE comparator reference voltage which is provided at the inverting input terminal of the ABOVE comparator 170. Therefore, if the probed tip voltage is greater than the reference voltage present at the non-inverting terminal of comparator 160, the output of comparator 160 will not activate the BELOW LED 24. However, if the voltage at the probe tip is within the overlap voltage range (i.e., greater than the ABOVE reference voltage at the inverting input of the comparator 170 and less than the BELOW reference voltage present at the non-inverting input terminal of comparator 160), then both comparator 160 and comparator 170 will provide output signals sufficient to actuate respective BELOW LED indicator 24 and ABOVE LED indicator 22.

In operation, the thumbwheel 28 may be rotated until both the ABOVE and BELOW indicators are illuminated. At that time the user can determine that the voltage present at the sensing probe is approximately the same as that indicated on the thumbwheel graduation.

The output of the comparator 170 is also fed back to its non-inverting input terminal via a capacitor 172 in order to provide positive feedback and insure proper response of the comparator to non-rectangular waveform inputs.

The output of the ABOVE comparator 170 is connected to supply its output to a coupling capacitor 182 in the non-triggerable one-shot multivibrator circuit 180. The capacitor 182 couples the rising edge of the output signal from the comparator 170 indicating an ABOVE signal level. The circuit 180 provides a fixed pulse to energize PULSE LED 36, providing a predetermined ON time followed by a predetermined OFF time. Rising edges that occur from the comparator 170 during the ON or OFF time periods are ignored by the circuit 180. Therefore, the output of the comparator 190 provides drive power for a fixed ON time for the PULSE LED 36 whenever the probe input voltage goes from below to above the voltage threshold setting of the thumbwheel 28.

With respect to the open circuit detection circuit 130, a diode 116 is connected between the negative terminal of the battery 114 and ground, to establish an internal −V supply reference one PN junction voltage drop below the ground clip 16 reference voltage. Resistor 132 is connected between the −V supply and a junction point for resistor 134 and the input signal line 13. The other end of resistor 134 is connected to a junction for resistor 136 and an inverting input terminal of a comparator 138. The opposite end of resistor 136 is connected to the +V supply. The network formed by resistors 132, 134 and 136 establishes a slightly negative bias voltage on the inverting input terminal of a comparator 138 with respect to the non-inverting input terminal, which is grounded. Thus, when the input signal on line 13 from the test probe 12 is connected to an open circuit or to a voltage potential below the ground level of clip 16, the inverting input terminal of comparator 138 remains at a lower voltage than the non-inverting input terminal. In that instance, the comparator 138 output remains in a high state. The output of the comparator 138 is connected to the LED enable circuit 140 and when the comparator 138 is providing a high level output voltage, transistor 142 is biased in an off condition which inhibits the activation of the LED indicators 22 and 24.

On the other hand, when the probe tip 12 is at the same level as the clip reference 16 or greater, the voltage level at the inverting input terminal of comparator 138 is greater than the voltge at the non-inverting input terminal. In that situation, the output of the comparator 138 is at a low state and biases the transistor 142 in a saturated condition, thereby enabling the activation of LED indicators 22 and 24. Zener diode 148, in series with a resistor 146, is connected between the +V supply and the base of transistor 142 and in combination with resistor 149 connected in series with the collector of transistor 142, provides current limiting for the LED indicators 22 and 24 when activated.

Figure 4:
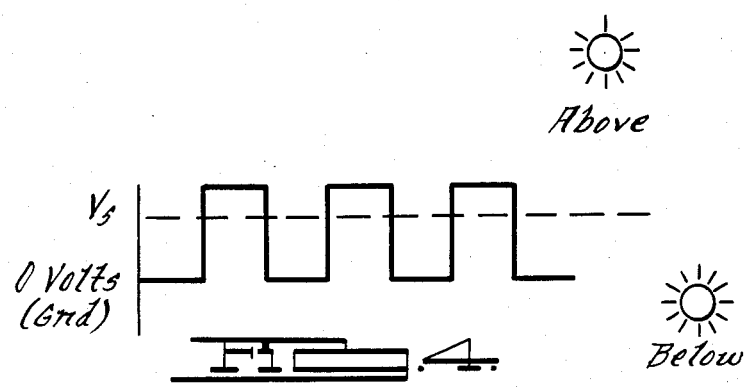
FIG. 4 is a waveform diagram illustrating the effects of a 50% duty cycle input signal.
Figure 5:
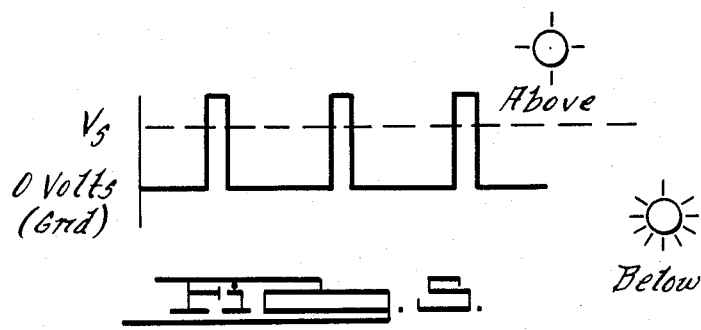
FIG. 5 is a waveform diagram illustrating the effects of an input signal having a duty cycle of approximately 10%.

In FIGS. 4 and 5, waveforms are illustrated to show how an operator can determine the relative duty cycle of a signal present at the test probe 12.

In FIG. 4, an example of a square wave signal is shown which has a frequency of approximately 1 KHZ and a 50% duty cycle. With the thumbwheel 28 set so that both the ABOVE and BELOW LED indicators are energized, the operator can tell that the input signal has a 50% duty cycle, since the ABOVE and BELOW LED's are of equal brightness. By adjusting the thumbwheel 28 until the ABOVE LED is de-energized, the operator can determine the maximum voltage value of the signal. That maximum voltage value can be read directly from the graduated indicia on the thumbwheel.

In FIG. 5, an input signal is exemplified having a duty cycle of approximately 12%. In that example, the ABOVE LED is significantly dimmer than the BELOW LED, when the thumbwheel is adjusted so that both LEDs are illuminated.

Figure 6:
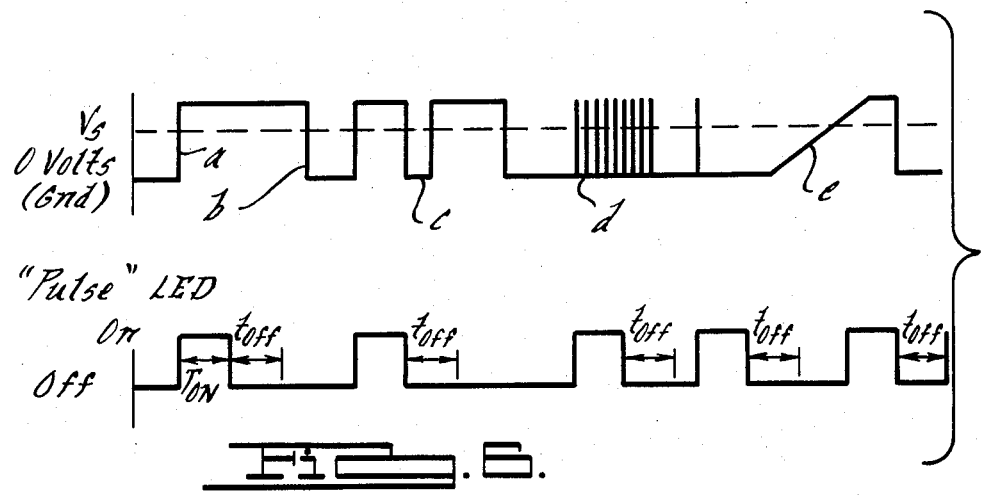
FIG. 6 is a waveform diagram illustrating the function of the PULSE indicator with respect to various input signals.

FIG. 6 illustrates the function of various types of input signals on the activation of the PULSE LED 36. As discussed, the PULSE LED is energized for each rising voltage which exceeds the threshold value set by the thumbwheel 28. Therefore, the rising edge "a" causes the LED 36 to be timed on for the $T_{on}$ period of 250 msec., followed by a $T_{off}$ period of 250 msec. When the following edge "b" occurs, the LED 36 is not effected. If, as shown at "c", a rising edge occurs while the LED 36 is in its $T_{on}+T_{off}$ period, the rising edge has no effect. This statement holds true no matter how many pulses occur during that $T_{on}+T_{off}$ period, as shown in "d". A slowly rising edge such as shown at "e" only causes the LED 36 to be energized when the rising edge rises above the threshold level set by thumbwheel 28.

Figure 7:
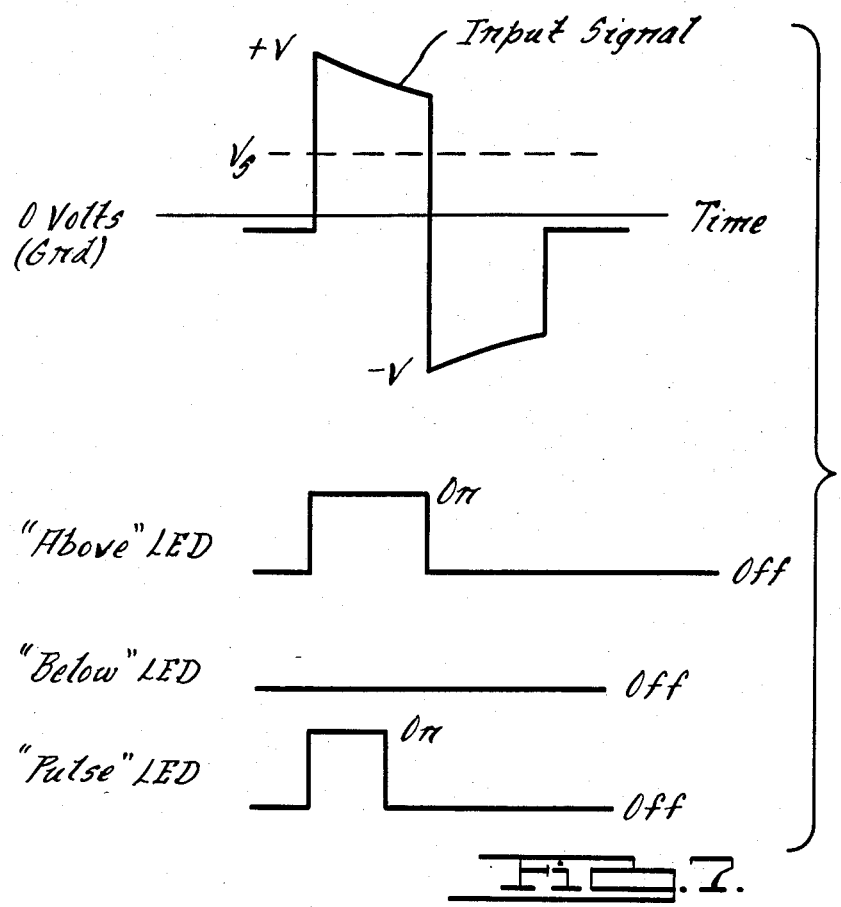
FIG. 7 illustrates the functions of various indicators in response to a particular input signal.

FIG. 7 illustrates the functions of the various circuits described above by showing the sequence of LED operations in response to a particular input signal. The input signal is shown as a square wave pulse that occurs on a reference level below ground and contains both a leading edge portion that rises from the reference level to a value above the set point selected on thumbwheel 28 and a falling edge portion that drops to a value below its reference level. The leading edge causes the PULSE LED to turn on for its predetermined time period, and causes the ABOVE LED to turn on until the signal returns below the set point. In this example, the falling edge of the signal traverses the ground reference potential in a negative direction and therefore inhibits the BELOW LED so that it cannot be activated. When the signal returns in a positive direction to its reference level, below zero volts, no LED's are activated.

Figure 8:
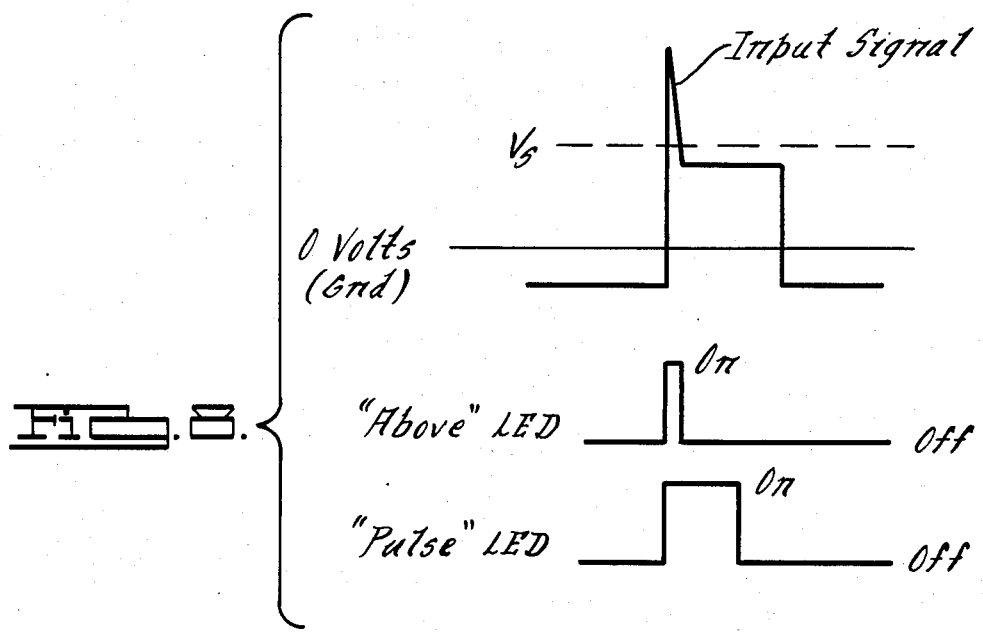
FIG. 8 is a waveform diagram illustrating the function of the PULSE indicator with respect to a relatively short input pulse.

FIG. 8 illustrates the effects of a short duration pulse occurring on a sampled signal. In this example, the rising edge of a pulse exceeds the thumbwheel set point and immediately returns to a level below the set point. Under such conditions, the ABOVE LED will be activated only during the period of time that the signal is above the set point. In this example, it would be activated for such a short time that an operator could not perceive the occurrence. However, the PULSE LED would be activated for its entire "on" period of 250 msec.

It will be apparent that many modifications and variations may be implemented without departing from the scope of the novel concept of this invention. Therefore, it is intended by the appended claims to cover all such modifications and variations which fall within the true spirit and scope of the invention.

What is claimed is:

1. A voltage sensor device comprising:
   a portable housing suitably sized for hand-held use;
   a first conductor means extending from one end of said housing for contacting a first voltage potential;
   a second conductor means extending from said housing for connection to a ground potential;
   means within said housing for providing a first adjustable reference D.C. voltage level;
   means connected to said first adjustable reference voltage providing means for providing a second reference D.C. voltage level that is continuously less than said first reference voltage level by a predetermined amount;
   thumbwheel means accessible on the outside of said portable housing for allowing manual adjustment of said first reference voltage level;
   means connected to said first adjustable reference voltage level providing means, said second reference voltage level providing means and said first conductor means to compare the first voltage potential with both said first reference voltage level, for providing a first D.C. output signal when said first voltage potential is less than said first reference voltage level, and said second reference voltage level, for providing a second D.C. output signal when said first voltage potential is greater than said second reference voltage level; and means for distinctively indicating the presence or absence of any of said output signals.

2. A device as in claim 1, wherein said comparing means provides both said first and second output signals whenever the voltage potential at said first conductor means is not greater than said first reference voltage level and is greater than said second reference voltage level.

3. A device as in claim 2, wherein said comparing means provides a third output signal for a predetermined period of time whenever the voltage potential at said first conductor means increases from below to above said second reference voltage level.

4. A device as in claim 3, wherein said comparing means provides said third signal for a predetermined period of time following said increase in said voltage potential at said first conductor means, followed by a predetermined period of time in which said third signal is inhibited.

5. A device as in claim 4, wherein thumbwheel means has a scale of values thereon, and said thumbwheel may be rotated to adjust the level of said first reference voltage.

6. A device as in claim 5, wherein said indicating means includes first, second and third light emitting elements connected to responsively indicate the presence or absence of respective first, second and third output signals.

* * * * *

UNITED STATES PATENT AND TRADEMARK OFFICE
CERTIFICATE OF CORRECTION

PATENT NO. : B1 4,634,971
DATED : January 24, 1989
INVENTOR(S) : Robert C. Johnson et al It is certified that error appears in the above-identified patent and that said Letters Patent is hereby corrected as shown below:

Claims 1 and 4 should appear as shown on the attached sheets.

1. A voltage sensor device comprising:
   a portable housing suitably sized for hand-held use;
   a first conductor means extending from one end of said housing for contacting a first voltage potential;
   a second conductor means extending from said housing for connection to a ground potential;
   means within said housing for providing a first adjustable reference D.C. voltage level;
   means connected to said first adjustable reference voltage providing means for providing a second reference D.C. voltage level that is continuously less than said first reference voltage level by a predetermined amount;
   thumbwheel means accessible on the outside of said portable housing for allowing manual adjustment of said first reference voltage level;
   means connected to said first adjustable reference voltage level providing means, said second reference voltage level providing means and said first conductor means to compare the first voltage potential with both said first reference voltage level, for providing a first D.C. output signal when said first voltage potential is less than said first reference voltage level, for providing a second D.C. output signal when said first voltage potential is greater than said second reference voltage level, for providing both said first and second output signals whenever the voltage potential at said first conductor means is both less than said first reference voltage level and greater than said second reference voltage level, and for providing a third output signal for a predetermined period of time whenever the voltage potential at said first conductor means increases from below to above said second reference voltage level; and
   means for distinctively indicating the presence or absence of any of said output signals.

UNITED STATES PATENT AND TRADEMARK OFFICE
CERTIFICATE OF CORRECTION

PATENT NO. : B1 4,634,971
DATED : January 24, 1989
INVENTOR(S) : Robert C. Johnson et al It is certified that error appears in the above-identified patent and that said Letters Patent is hereby corrected as shown below:

4. A device as in claim [3] 1, wherein said comparing means provides said third signal for a predetermined period of time following said increase in said voltage potential at said first conductor means, followed by a predetermined period of time in which said third signal is inhibied.

Signed and Sealed this

Fifteenth Day of August, 1989

Attest:

DONALD J. QUIGG

Attesting Officer

Commissioner of Patents and Trademarks

REEXAMINATION CERTIFICATE (1003rd)
United States Patent [19]
Johnson et al.

[11] B1 4,634,971
[45] Certificate Issued  Jan. 24, 1989

[54] PORTABLE HAND-HELD VOLTAGE SENSOR WITH MANUALLY ADJUSTABLE REFERENCE VOLTAGE FOR COMPARISON WITH SENSED VOLTAGE

[75] Inventors: Robert C. Johnson, Dearborn; David L. Perry, Canton; Bernd E. Peitsch, Sterling Heights, all of Mich.

[73] Assignee: Ford Motor Company, Dearborn, Mich.

Reexamination Request:
No. 90/001,371, Nov. 16, 1987

Reexamination Certificate for:
Patent No.: 4,634,971
Issued: Jan. 6, 1987
Appl. No.: 429,415
Filed: Sep. 30, 1982

[51] Int. Cl.$^4$ .................. G01R 19/165; G01R 15/08
[52] U.S. Cl. .................. 324/133; 324/72.5; 324/115; 324/149; 340/661

[58] Field of Search .................. 324/133, 72.5, 158 P, 324/149, 122, 135, 96; 340/660–663, 511; 307/360, 354, 362, 363; 361/90

[56]  References Cited
U.S. PATENT DOCUMENTS
4,186,342  1/1980  Kyle .................. 455/218

FOREIGN PATENT DOCUMENTS
1447291  8/1976  United Kingdom .

OTHER PUBLICATIONS
Fordham Radio catalog, vol 14, No. 5, 1988.

Primary Examiner—Reinhard J. Eisenzopf

[57] ABSTRACT

A hand held voltage sensor in which a low impedance test lamp mode or a high impedance voltage test mode is selectable via a thumb accessed slide switch. In the high impedance mode, three light emitting elements provide indication of the value of voltage potential between a probe conductor and an associated ground conductor being above, below or pulsing above an adjustable threshold level.

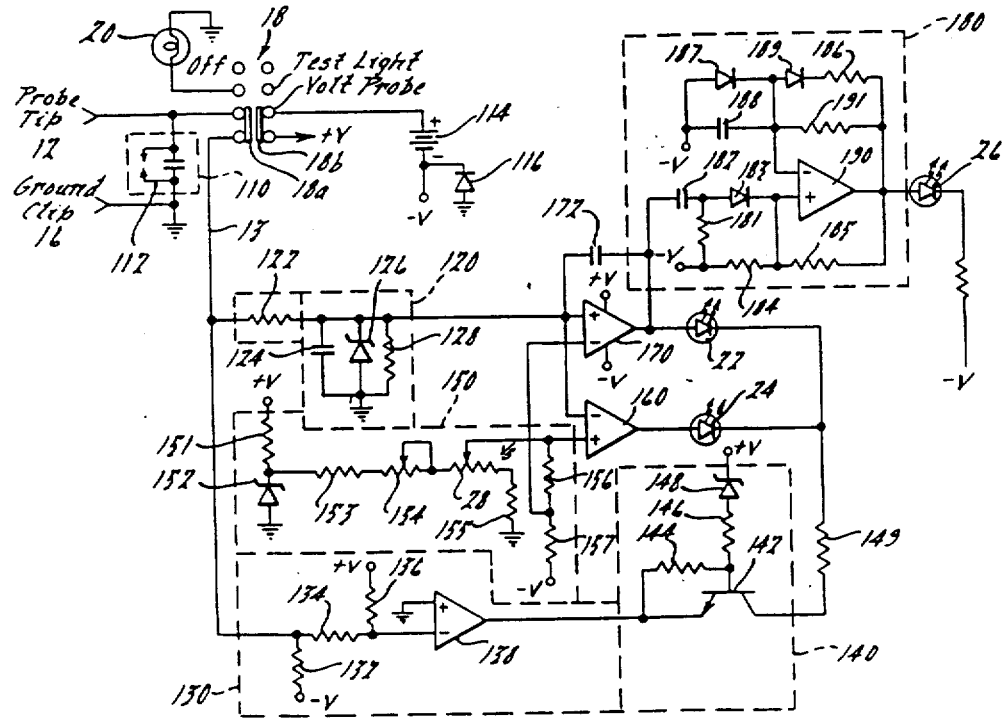

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2 and 3 are cancelled.

Claims 1 and 4 are determined to be patentable as amended.

Claims 5 and 6, dependent on an amended claim, are determined to be patentable.

* * * * *